United States Patent
Rawls, Jr. et al.

[11] Patent Number: 5,197,492
[45] Date of Patent: * Mar. 30, 1993

[54] FOCUSED MAGNETIC DIRECTIONAL POLARITIES

[75] Inventors: Walter C. Rawls, Jr., Jacksonville, Fla.; Gregory J. Provell, Somerset, N.J.

[73] Assignee: Bio Magnetics Systems Inc., Newark, N.J.

[*] Notice: The portion of the term of this patent subsequent to Mar. 26, 2008 has been disclaimed.

[21] Appl. No.: 674,923

[22] Filed: Mar. 26, 1991

Related U.S. Application Data

[63] Continuation-in-part of Ser. No. 380,873, Jul. 17, 1989, Pat. No. 5,002,068.

[51] Int. Cl.⁵ .................. A61F 5/37; A61B 19/00
[52] U.S. Cl. ....................... 128/846; 128/849
[58] Field of Search .................. 128/849–856, 128/798, 802, 908, DIG. 18, 846

[56] References Cited

U.S. PATENT DOCUMENTS

| | | | |
|---|---|---|---|
| 3,310,053 | 3/1967 | Greenwood | 128/846 |
| 4,901,738 | 2/1990 | Brink | 128/849 |
| 5,002,068 | 3/1991 | Provell | 128/849 |

*Primary Examiner*—Michael A. Brown
*Attorney, Agent, or Firm*—Sheldon H. Parker

[57] ABSTRACT

A method is provided for focusing magnetic fields, reducing magnetic fields and shielding animate or inanimate subjects from magnetic fields. Further a media which has been subjected to a shielded or focused magnetic field is applied to a subject, as for example, topically. The method, in part, interposes between the subjects and the source of a magnetic field, at least one second magnetic field disposed in such a manner that the polarity of the second magnetic field cancels or at least partially neutralizes the magnetic strength of the first magnetic field. The second magnetic field can also be disposed so as to permit only a portion of the first magnetic field to escape shielding and thereby focused in a predetermined direction. Devices which normally emit magnetic energy and containing the shielding of the present invention are also provided.

15 Claims, 5 Drawing Sheets

FOCUSED MAGNETIC DIRECTIONAL POLARITIES

CROSS-REFERENCE TO RELATED PATENT APPLICATIONS

This application is a continuation-in-part of copending patent application, Ser. No. 07/380,873, filed Jul. 17, 1989, entitled "Shielding and Focusing of Magnetic Fields", now U.S. Pat. No. 5,002,068, the subject matter of which is incorporated herein, in full, as though recited in detail.

BACKGROUND OF THE INVENTION (1) Field of the Invention

This invention relates generally to magnetic energies derived from a specific magnetic field. In one aspect, this invention is directed to shielding of human and inanimate subjects from magnetic fields and a method for shielding humans from electromagnetic fields such as those generated by transmission lines, magnetic resonance imaging devices and the like. The invention also is directed to the utilization of such shielding to focus electromagnetic energy and to provide devices equipped with such shielding. Another aspect of the invention is the use of the focused magnetic energies of a particular unidirectional magnetic field.

(2) Description of the Related Art

Recently there has been a rising concern by scientists and an increasing awareness on the part of the public in general, of the potential health hazards of electromagnetic fields. The scientific evidence is increasing daily which indicates that exposure to magnetic fields might conceivable cause adverse health effects in the cells of the human body. A comprehensive background paper was recently issued by the Congressional Office of Technology Assessment which was prepared by a team at Carnegie Mellon University and which indicated that the emerging evidence no longer allows one to categorically assert that there are no risks associated with electromagnetic fields radiated by cables, wires, fixtures and appliances in general.

Although scientists have generally assured the public that there was no danger to health, the uncertainty engendered by often contradictory data causes some degree of concern.

Moreover, while the electromagnetic fields radiated by fixtures and appliances found in the home or workplace may be of a relatively low level, more sophisticated equipment such as transmission lines, large electrical transformers, as well as the more recent magnetic resonance imaging devices, which radiate greater magnetic field strengths, are undoubtedly of greater concern. Magnetism and its effects have been widely discussed in the past and it is evident that magnetic energy does indeed effect the living organism such as humans and agricultural products.

A wide variety of methods have been reported in the literature which are directed to the use of magnetic energy as a diagnostic technique and also for the treatment of diseases in warm blooded animals including humans. For example, magnetic energy has been utilized quite successfully over the past several years to promote the formation of osteoblasts in conjunction with the healing of bone fractures. In many instances markedly improved results in healing times have been achieved by the application of magnetic energy to the site of bone fractures and other injuries.

The search for a biological effect due to magnetic fields has a long history dating back a hundred years. The literature on biomagnetic effects on the growth and development of various organisms has been quite extensive showing both positive and negative findings. Among the positive findings attributed to strong magnetic fields are: altered growth rate, enzyme activities, cellular metabolism, DNA synthesis and animal orientation. While the mutagenic abilities of strong magnetic fields have been controversial, a direct cytotoxic effect on mammalian cells has not been reported. As long ago as 1963, experiments were performed with a 56 kilogauss static field generated in an electromagnet at the Clarendon Laboratory at Oxford: at the time the strongest magnetic field available in the world, which showed no cytotoxicity with mammalian cells cultured in vitro for exposures up to several hours. The recent availability of powerful permanent ceramic magnets prompted the present studies which showed that to produce cytotoxicity the magnetic field needed to be varied.

Previous development of directional magnetic fields began in 1936, when A. R. Davis first discovered that the north and the south magnetic pole fields each exhibited unique properties with respect to their effects on various forms of life. This discovery was slow to be accepted because of investigations by others who confused Davis' directional polarities magnetic fields with those which are simultaneously emitted by horse shoe type magnets and by AC-powered electromagnets. The common belief over the years relating to magnets has been that the two magnetic poles, north and south, are homogeneous and that they emanate the same potential type of energy. This belief has been found to be a misconception, since the two poles of a magnet are totally different in electric potential and effect. Correspondingly, the application of the respective poles to living systems has been found to produce quite different results. More specifically, it has been shown that magnetic energy has an effect on cells such as blood cells, nerves, bacteria, et al.

It is also believed that magnetic energy has an effect on cells such as blood cells, nerve tissue cells and the like. Preliminary investigations regarding biological effects of exposure to magnetic fields have indicated a polarity dependence. Cells are deemed to be bioelectric in nature, function and behavior and studies have indicated that directional magnetic fields enhance biological activity. Moreover, due to the orientation of such cells and of the metal elements and other ions contained therein, the blood cells have been found to decrease certain biological effects when exposed to the north pole and to increase other biological effect when exposed to the magnetic south pole. This same type of reaction has been noted in connection with the other type cells of the body, it having been observed that, as a general matter, the application of north pole energies to an existing unhealthy or abnormal condition tends to have an arresting, quieting or relaxing effect, to induce an overall healing reaction akin to the body's own defense mechanism. On the other hand, the application of south pole energies tends to have a strengthening, activating effect, which has been found useful in treating some abnormal conditions, particularly those associated with a slowing or weakening in function. Cancer cells exposed to the north field show a significant decrease in the number of surviving cells after a period of incubation. Conversely, the same type of cells, when exposed to the south field, indicated an increase in the number of surviving cells compared to the unexposed controls. A more detailed description of magnetic pole energies can be found in Davis et al, *Magnetism and its Effects On the Living System*, Acres U.S.A., Kansas City Mo. (1974) and Davis et al, *The Magnetic Effect*, Acres U.S.A., Kansas City Mo. (1975).

Radiotherapy and chemotherapy are important modalities used to treat many types of human cancer. A major virtue of radiotherapy is that radiation beams can be aimed to encompass a target volume including the tumor while avoiding systemic effects. Within the target volume itself, radiation does not distinguish well between normal and malignant tissues and the small differential that does exist requires the exploitation of kinetic differences in a protracted multifraction regimen. On the other hand, some chemotherapy agents show a big differential in cytotoxicity between dividing and non-dividing cells, if not between normal and malignant cells per se, but the concomitant problem is systemic toxicity since the drug cannot be aimed. It would appear that a varying magnetic field may combine the best features of radio- and chemo- therapy; i.e. a big differential in cytotoxicity between dividing and plateau phase cells and the possibility of being aimed at a limited tumor volume, In U.S. Pat. No. 3,337,776, which issued Aug. 22, 1967, there is disclosed an apparatus for generating magnetic fields which are indicated to be particularly useful for biomedical applications. Although the patentee is not specific as to individual applications, he does state that magnetic fields generated by the apparatus can decrease metabolism values and reacts on the spastic syndrome.

A magnetic probe is disclosed and claimed in U.S. Pat. No. 3,664,327 which issued May 23, 1972 and states that the probe can be employed in relatively inaccessible locations, such as in body cavities of animals to cause relaxation of muscle tissue.

A magnetic medical treatment device is disclosed in U.S. Pat. No. 3,921,620 which states that the effects of a magnetic field upon a living body are due to the fact that the electrolyte within the living body is dissociated by polarization and induced currents and is effective in controlling the sympathetic nervous system.

On May 3, 1977, U.S. Pat. No. 4,020,590 issued to A. R. Davis and discloses an apparatus and method for treating seeds in a unipolar magnetic field. It is indicated in the patent that this treatment enhances the germination rate of the seeds, as well as providing plants having greater sugar content, increased protein and other desirable features.

In U.S. Pat. No. 4,134,935 which issued Jan. 16, 1979 also to A. R. Davis, a method is disclosed and claimed which uses magnetic fields for clinical examination of animals to determine damaged, diseased, abnormal or malfunctioning parts of the body. Changes in tensioning and relaxation of the body extremities are an indication of body abnormalities.

A method for treating cancer is disclosed in U.S. Pat. No. 4,622,952 which issued Nov. 18, 1986 and which involves timing an electromagnetic energy to the resonant energy absorption frequencies of the intracellular structures of the selected cells and then exposing a subject to this tuned electromagnetic energy field. The field can also be tuned to the frequency which has been calculated to be closest to the resonant frequency of the cancer cells and furthest from the normal cells.

U.S. Pat. No. 4,622,953, which issued to the same patentee, disclosed the identical procedure for the treatment of atherosclerotic lesions. In this process, metabolic and activity varying substances such as ferric hydroxide and dextran were employed and by applying the proper resonant energy, the heat in the diseased cell is increased by an increment sufficient to kill the diseased cell but not sufficient to kill normal cells.

In a patent issued to Robert T. Gordon on May 5, 1987, U.S. Pat. No. 4,602,359, a process is described and claimed for the treatment of cancer in a host organism which comprises providing to the host organism minute particles capable of being inductively heated and which are of a size which can be absorbed into cancer cells. Thereafter the organism is subjected to an alternating electromagnetic field to heat the particles at that point in metabolic time when the maximum difference in magnetic susceptibility between the cancer cells and normal cells within the region occurs, and then continuing the inductive heating to increase intracellular temperature to selectively kill the cancer cells.

The north pole, which is defined as the north seeking pole, is now believed to provide a negative form of energy while the south pole, which is defined as the south seeking pole, is believed to provide a positive form of energy. It has also been found upon examination of the electron paths associated with the fields surrounding the respective poles that the south pole end of a magnet provides a right hand spin of electrons, i.e., a clockwise rotation of electron movement, as contrasted with the north pole electron spin, which provide a left hand spin or counterclockwise rotation of its electron field.

It has been further observed that the lines of magnetic energy leave the south pole to re-enter the magnet at the Bloch Wall where the 180 degree phase takes place, and leave the Bloch Wall at that point to go on as the north pole energy to re-enter the magnet at its north pole.

It is therefore evident that magnetic energies do indeed have an effect upon plants and living organisms, and which in some instances may be detrimental.

Surveys of magnetic resonance imaging devices and other types of equipment capable of producing appreciable magnetic fields were performed in order to determine the polarity and intensity of magnetic fields in areas where there are potentials of both occupational exposure and exposure to members of the general public.

Considering the potential significance of the foregoing, exposure to the South field from devices radiating such energy should be as low as is reasonably achievable.

Accordingly, one or more of the following objects will be achieved by the practice of this invention. It is an object of this invention to provide a method for shielding human and inanimate objects from magnetic fields. Another object is to provide a shielding for humans from electromagnetic fields such as those generated by transmission lines, magnetic resonance imaging devices and the like. A further object of the invention is to provide devices equipped with appropriate shielding. These and other objects will readily become apparent to those skilled in the art in the light of the teachings therein set forth.

SUMMARY OF THE INVENTION

In its broad aspect this invention is directed to a method for shielding humans and inanimate subjects from magnetic fields. The method comprises, in part, interposing between the subjects and the source of a magnetic field, at least one second magnetic field disposed in such a manner that the polarity of the second magnetic field cancels or at least partially neutralizes the magnetic strength of the first magnetic field. The second magnetic field can also be disposed so as to permit only a portion of the first magnetic field to escape shielding and thereby focus the magnetic energy in a predetermined direction. Devices which normally emit magnetic energy and containing the shielding of the present invention are also provided.

BRIEF DESCRIPTION OF THE DRAWINGS

The objects of the invention will become more apparent when the specification is read in conjunction with the drawings wherein.

DETAILED DESCRIPTION OF THE INVENTION

Figure 1:
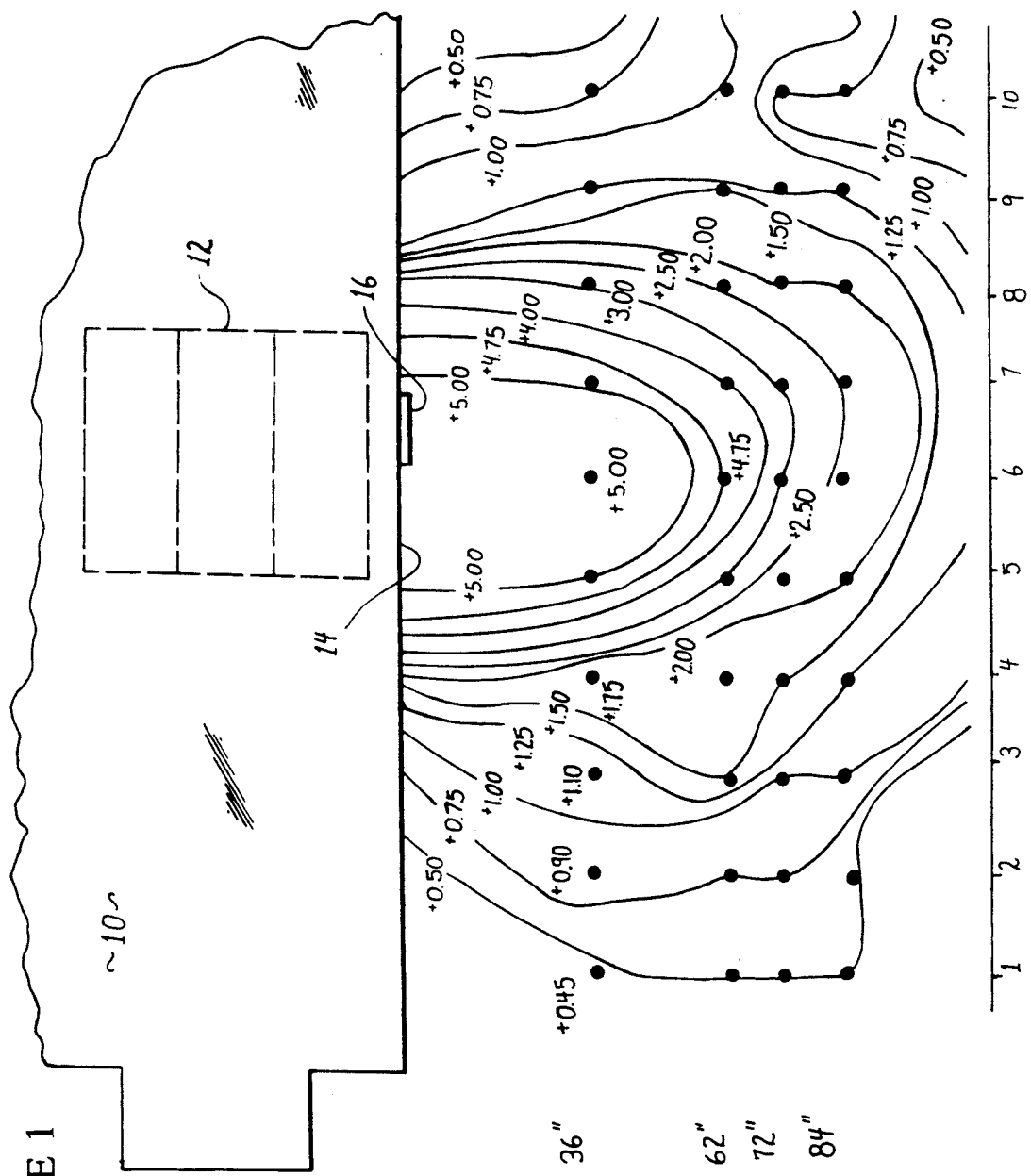
FIG. 1 is a schematic drawing looking down on the top of a mobile trailer housing a magnetic resonance imaging unit.

As indicated above, an aspect of the present invention is directed to a method of shielding magnetic energy radiating or emanating from a magnetic source. Using the shielding in accordance with the procedure of this invention can greatly reduce or even eliminate potential danger from a magnetic field, especially energy from any South field.

While it has not been established with certainty, the current views seem to tend towards the possibility that magnetic fields, especially the South magnetic field may adversely effect living organisms. It is with this in mind that the present invention was conceived in order to reduce or eliminate exposure of humans and inanimate objects to unnecessary magnetic energy. While many of the devices used in the home today emit little magnetic energy, there are other devices wherein exposure to their magnetic field may have adverse consequences.

Since there are few, if any, materials which can not be penetrated by magnetic energy, it was found that the best way to reduce or eliminate unwanted magnetic energy was to utilize a separate an opposing magnetic field to counteract the energy of the first magnetic source. Accordingly, it was found that by using one or more magnets of a lesser strength, but located and oriented in a set fashion, the undesirable effect of the first magnetic source could be counteracted.

Since the magnetic field strength weakens in proportion to the distance away from the magnetic source, it was found that a magnet of a relative low strength if properly placed could effectively eliminate unwanted radiation. As noted in Examples 1-5 which follow, a shield of a lesser strength placed at a predetermined distance from the magnetic source, was effective in completely neutralizing the magnetic energy.

It has been found that the second magnetic field which comprises the shield, can be fabricated from a wide variety of materials and in a wide variety of configurations. For example, ferrite particles or powders can be embedded in a variety of plastic or other materials which can then be made into a wide variety of shapes and sizes. When such materials are rendered magnetic, then can serve as excellent shields for use in the method of the present invention. Such materials can be obtained from the Fermag Company of Edison, N.J. in various strengths of their magnetic fields. For example, magnetic shielding can be obtained having magnetic field strengths of from about 1000 to about 1500 gauss and higher. The actual strength need will of course be determined by the strength of the magnetic source and the proximity of the shielding to the source.

As indicated, the shielding can be fabricated in a wide variety of shapes and sizes as well as thicknesses. In many instances, using the shield in the form of sheets will be sufficient and such sheets can be arranged in several layers one behind the other if necessary. In other instances, it may be necessary to have the shield configured into a cylindrical, spherical or other shape in order to provide the optimum shielding of the first magnetic source. Additionally, while the shielding can be a magnetized material, it is also possible to have the shielding be an electromagnet whose power is derived form an electrical source.

Measurement of the field strength of the first magnetic source and of the second magnetic source or shielding, can be done with a gaussmeter such as Model 5-0-5, which can be obtained from the Annis Company of Ind. Also, a magnetometer is available from the Albert Roy Davis Research Laboratory, of Green Cove Springs, Fla. To identify the poles using this device, the side or end of the magnet is brought up to the meter. If the needle moves to the right ($+$), it is the South pole energy that is being measured. If the needle moves to the left ($-$) it is the North pole of the magnet.

The distance between the magnetic source and the meter varies with the magnetic strength. For this magnetometer, $\frac{1}{2}$ inch is about 150 Gauss; 1 inch, 200 Gauss; 1 and $\frac{1}{2}$ inch 300 Gauss, 2 and $\frac{1}{2}$ inches 500 Gauss; 5 inches, 1800 Gauss; 9 inches, 3500 Gauss; 12 inches 4500 Gauss; and the like. Although different gaussmeters will have different scales, the data obtained with one meter will be relative to the different field strengths for the particular magnets tested and the distance of the meter from the magnetic source.

In general, it has been observed that the energy radiating from the South pole is the energy which might have adverse effects on humans. Thus, by utilizing a shield in accordance with the teachings of this invention wherein this South pole energy is neutralized, humans can be protected from such adverse effects.

The following examples are illustrative of the present invention.

EXAMPLES 1-5

In order to demonstrate that a source of magnetic energy can be adequately shielded, a magnet having a field strength of approximately 3500 gauss was placed in a flat surface. A magnetic shield in the form of a sheet was placed about six inches from the surface of the magnet which radiated a south ($+$) field. The magnetic shield employed was obtained from the Fermag Company of Edison, N.J. and was comprised of magnetic ferrite embedded in a pliable substrate material. The shield was in the form of a flat sheet of no great than 0.25 inches in thickness and had a magnetic strength of 1200 gauss. The shield was placed vertically so that its flat surface was parallel to the magnet and yet perpendicular to the magnetic field radiating therefrom. The shield was oriented so that its south (+) field faced the magnet.

The strength of the magnetic field was measured using a gaussmeter (Model 5-0-5, obtained from the Annis Company of Ind. and placed about 9.5 inches from the magnet) about 3.5 inches behind the shield when the shield was in place. The measurements obtained are set forth below in Table I.

TABLE I

| Example | Gaussmeter Reading | |
|---|---|---|
| | Unshielded | Shielded |
| 1 | +4.00 | +0.5 |
| 2 | +4.50 | 0.0 |
| 3 | +5.0 | 0.0 |
| 4 | +5.0 | +0.5 |
| 5 | +5.0 | +1.0 |

EXAMPLE 6

A survey was made at a large northeast research institution and indicated that fairly high intensities of magnetic fields could be detected in areas adjacent to various devices. This prompted a survey of an operating mobile magnetic resonance imaging unit to determine whether high levels of magnetic energy was being emitted from such unit. An examination of the console regularly occupied by the staff personnel in the room housing the MRI magnets, showed that the intensity levels were substantially higher and areas of both positive (South field) and negative (North field) were measured. This unit was a 0.3 Tesla Hybrid Resistive magnet with magnetic bricks. The field polarity is obviously determined by the configuration of the components.

Substantial levels were measured outside of the trailer 10 housing the unit 12 which also was posted with a sign indicating "Magnet Hazard". In the single drawing, there is depicted a schematic top view of the trailer 10, showing the approximate location of the magnet 12, of the MRI unit and the side 14, from which actual measurements of the field strengths were made. Warning sign 16, was on the outer trailer wall at approximately the location of the MRI unit inside. The scale on the side of the drawing is in inches measured away from the side of the trailer.

It is evident from the data obtained that there is substantial magnetic radiation from the side of the MRI mobile unit and which is the less desirable positive type of radiation. Although there is no correlation yet available to connect the intensity of the magnetic field with any detrimental effects on humans, the mere fact that the mobile unit contains the "Magnet Hazard" warning sign on the trailer should be sufficient to encourage using an appropriate shielding. The particular unit for which the measurements were made, was located on a city street where pedestrians would pass through the field depicted in the drawing.

Although the invention has been illustrated by the preceding examples, it is not to be construed as being limited to the materials employed therein, but rather, the invention is directed to the generic area as herein before disclosed. Various modifications and embodiments of the invention can be made without departing from the spirit or scope thereof.

Another set of experiments were conducted wherein mammalian cells growing in culture were exposed to a varying magnetic field having a maximum intensity of 6.8 kilogauss. The cell cultures remained stationary, while two permanent ceramic magnets were rotated at 16 rev/min so that each magnet passed under the cells once during each revolution. Exponentially growing cultures of either A549 human lung carcinoma cells or $C_3H/1OT-\frac{1}{2}$ mouse embryo fibroblasts were exposed to the varying field. By about 3 days, cell growth was arrested, and the fraction of cells surviving was of the order of $10^{-'}$. By contrast, no measurable cell killing was observed in confluent cultures of $C_3H/1OT-1/2$ cells showing contact inhibition. The substantial cytotoxicity shown by this varying magnetic field and the striking differential between the level of killing observed in dividing versus plateau phase cells, suggests that this might be useful to treat rapidly growing tumors in a relatively slow growing normal tissue.

The effect of magnetic fields on exponentially growing cells compared with control cultures consists of two components. First, the total number of cells is reduced, implying that cell growth is inhibited. Second, of the cells present, a proportion have lost their clonogenicity and this proportion increases with time of exposure to the field. With the field strength and period of oscillation used, a 72 hour exposure results in 10-fold fewer cells on the treated than on the control flasks, and of these only 1/10 are clonogenic. A further increase in exposure time results in too few viable cells to assay.

The key to producing a cytotoxic effect by means of a magnetic field appears to be a combination of a sufficiently intense magnetic field and a suitable variation of that field applied for a prolonged period. A steady or constant magnetic field of similar, or even higher intensity, does not produce a cytotoxic effect over the time periods studied.

The effect on cytotoxicity of modifying the magnetic field intensity and the rate of change of magnetic field strength is currently under intense investigation; there are evidently several different parameters that can be varied and the relative importance of each is not yet clear.

The instant invention involves only cells cultured in vitro, however, the substantial cytotoxic effect of the varying magnetic field and the fact that it can be manipulated to cover various areas and volumes, and the dramatic differential in cell killing between dividing and plateau phase cells suggests that this may be a useful anti-cancer device that merits further investigation.

C3H 1OT1/2 mouse embryo fibroblasts were used. These cells exhibited contact inhibition of growth and anchorage dependence under normal culture conditions. Cells were maintained in Eagle's Basal medium supplemented with 10% heat inactivated fetal bovine serum (Hyclone Laboratories, Logan, Utah) and 25 /ml gentamycin (U.S. Biochemicals, Cleveland, Ohio).

A549 human lung carcinoma cells were maintained in Eagle's Minimun Essential Medium Supplemented with 15% fetal bovine serum, 25 g/ml gentamycin, 1% glutamine and 0.1% sodium pyruvate (Grand Island Biological Supplies, Grand Island, N.Y.).

TESTING

Exponentially growing C3H IOTI/2 and A549 cells were trypsinized and related at $1 \times 10'$ cells and $5 \times 10''$ cells respectively per 25 cm' area tissue culture flask (Corning) in 10 ml medium. Forty eight hours after plating, the caps of the flasks were closed tightly and the cultures were Fmt into a water-jacketed incubator fitted with a custom-built motor assembly for varying field magnetic treatment at 37 C. A constant 16 rpm gear-head motor was used and was placed inside the incubator. The shaft of the motor was connected to a lucite platform onto which two sets of ceramic monopolar magnets were positioned 12.5 cm apart. The maximum intensity of the magnets was 6.8 kilogauss. The lucite platform could be adjusted by raising or lowering the shaft of the motor. Culture flasks exposed to the varying fields were placed on an aluminum tray 2 mm above the rotating magnets. The position of the flasks on the holding tray were bounded by the circumference of the revolving magnetic bars. A maximum of 13 T25 cm' area flasks could be treated at any one time. Control flasks were placed on a tray at the bottom of the incubator where the magnetic field as determined by a gauss meter was minimal.

In experiments involving plateau phase cultures of C3H 10T½ cells, exponentially growing cells were plated at $5 \times 10^5$ cells per flask in 10 ml. tissue culture medium four days before initiation of treatment. Bromodeoxyuridine labeling ($5 \times 10^{-6}M$) for one cell cycle showed the cells to be in plateau phase with less than 6% cycling.

To determine the growth kinetics of cultured cells treated with the varying fields, duplicate flasks were removed from the incubator together with an equal number of control cultures. The sampling times chosen were 2 hrs. and 6 hrs., after the initiation of treatment, and at daily intervals thereafter for up to 4 to 6 days. The cultures were trypsinized, counted and the total number of cells per flask determined using a Coulter electronic counter.

To determine the surviving fractions of both exponentially and plateau-phase treated cultures of C3H 10%½ cells, the cultures were trypsinized, counted and replated into 100 mm diameter tissue culture dishes at a density such that 50-60 viable cells would survive and form colonies. The cultures were incubated for 10-12 days at which time they were fixed with formaldehyde, stained with Giemsa and counted for colony formation.

Figure 3:
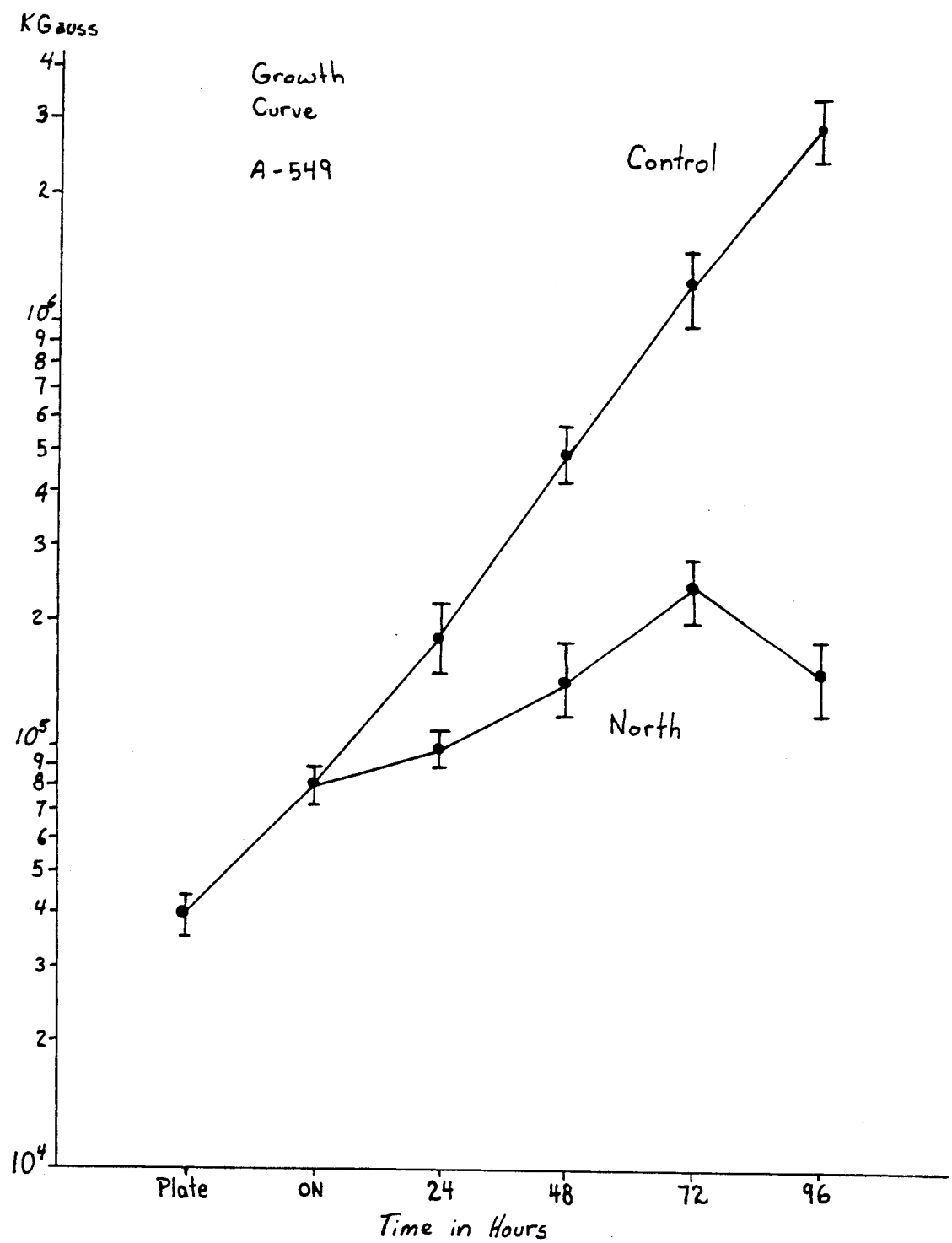
FIG. 3 is a graph of the growth curves for mouse cultures exposed to a varying magnetic field.

In FIG. 3 the growth curves for control mouse cultures exposed to a varying magnetic field (maximum value 6 kilogauss) for various periods of time are illustrated. Shown are the total number of cells/dish and the total number of viable cells per dish, i.e. the number capable of forming colonies. Each point represents pooled data from 2 experiments. Bar represents ± I.S.D. Data for exponential phase cultures are depicted in the left-hand panel. Control cells incubated in the same incubation as the treated cultures had a doubling time of 18 hours and was comparable to published data for normal C3H IOTI/2 cells. Six hours after the initiation of magnetic treatment, the treated cells already demonstrated signs of growth inhibition. By 72 hours after treatment, the total number of cells per treated flask was roughly 1/10 of that of the control. The number of clonogenically viable cells, based on the plating efficiencies and the surviving fractions also changed with the duration of treatment. By the end of 72 hours, the number of reproductively viable cells was only one-tenth of the cell population. Data for plateau phase cultures of C3H IOTI/2 cells are shown in the right-hand panel. Essentially no difference was observed in the total cell number between the treated vs. control cultures. Although the number of clonogenically viable cells also showed a modest decrease after treatment for 3 days the effect was less dramatic than that for exponentially phase cultures.

Figure 4:
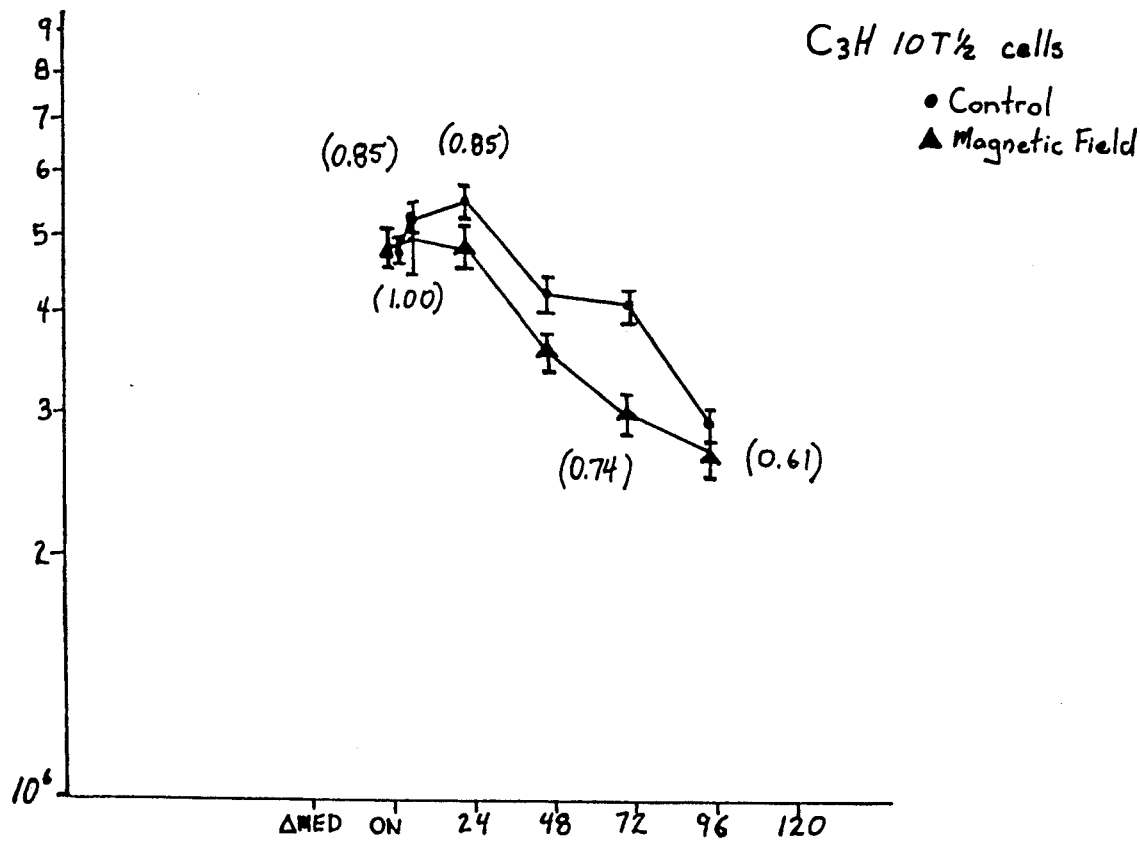
FIG. 4 is a graph of the survival date for exponentionally growing and plateau phase cells exposed to the varying magnetic field.

FIG. 4 shows the survival data for exponentially growing and plateau phase c,H/lOT-½ cells exposed to the varying magnetic field for various periods of time. For each time point examined, cells were removed by trypsinization from replicate flasks from control and treated groups, and aliquots of cells replated into fresh medium to assay for clonogenicity. The fraction of cells forming colonies from treated and control flasks gives the surviving fraction. Each point represents pooled data from 2–3 experiments. Bar represents + S.E. The surviving fractions of either exponential or plateau phase C3H lOTI/2 cells treated with the varying magnetic field for various periods of time are shown. A three (3) day treatment resulted in a 10% survival for actively growing cells whereas contact inhibited cells showed only a 20% killing level.

Figure 5:
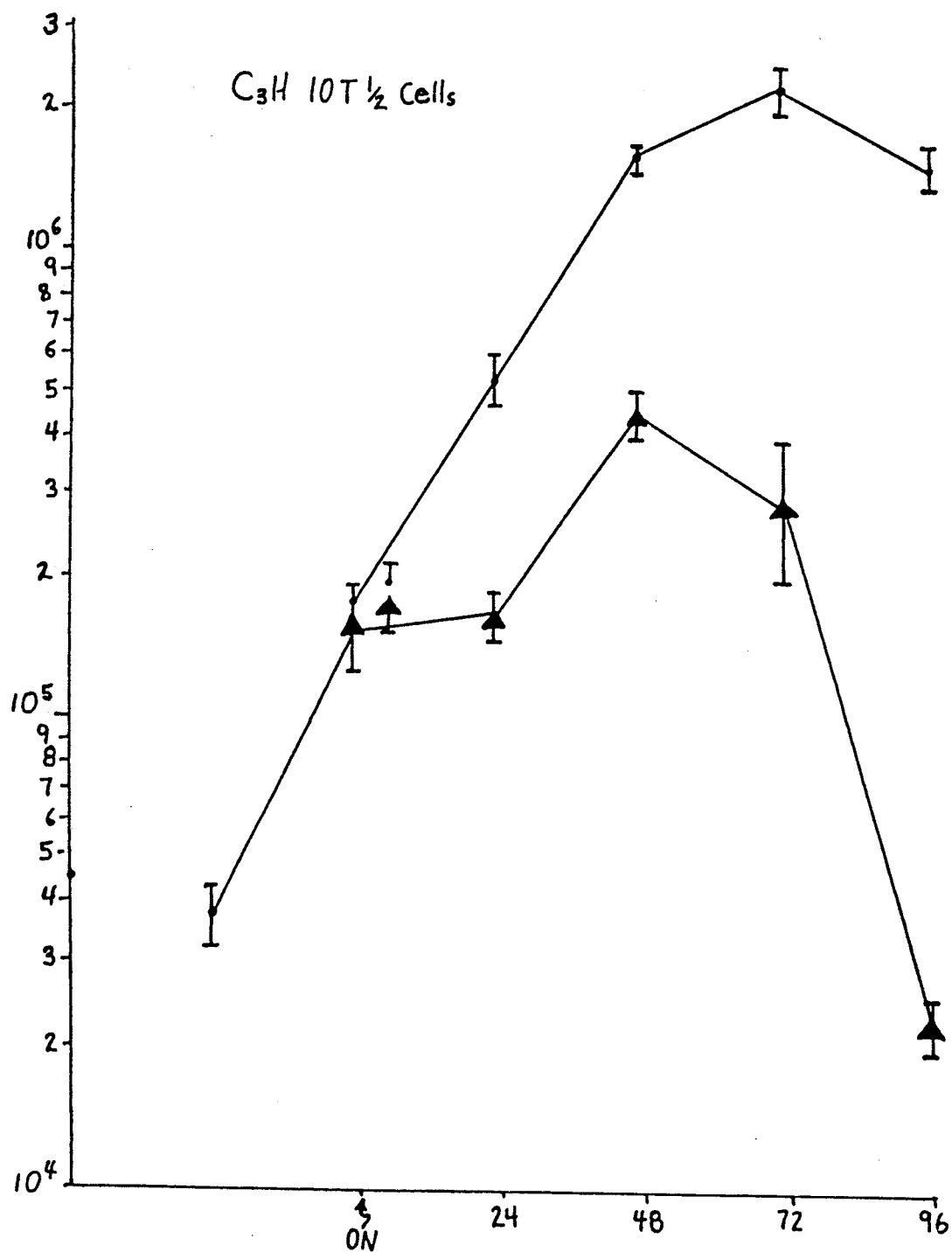
FIG. 5 is a graph illustrating growth curves for control and parallel cultures exposed to a varying magnetic field.

The growth inhibitory effects of a varying magnetic field on a human tumor cell line are shown in FIG. 5. Growth curves for control S549 and for parallel cultures exposed to a varying magnetic field (maximum value about 6.8 kilogauss for various periods of time are shown. The data points shown correspond to the total number of cells per dish. Each point represents pooled data from 2 experiments. Bar represents + I.S.D. The human lung carcinoma cells have a doubling time similar to that of C3H IOTI/2 cells ($-18$ to 20 hours). There was a significant difference in total cell numbers between the treated and control cultures at 24 hours after treatment. By 72 hours after treatment, the number of treated cells was roughly 1/IO of that for control.

Figure 2:
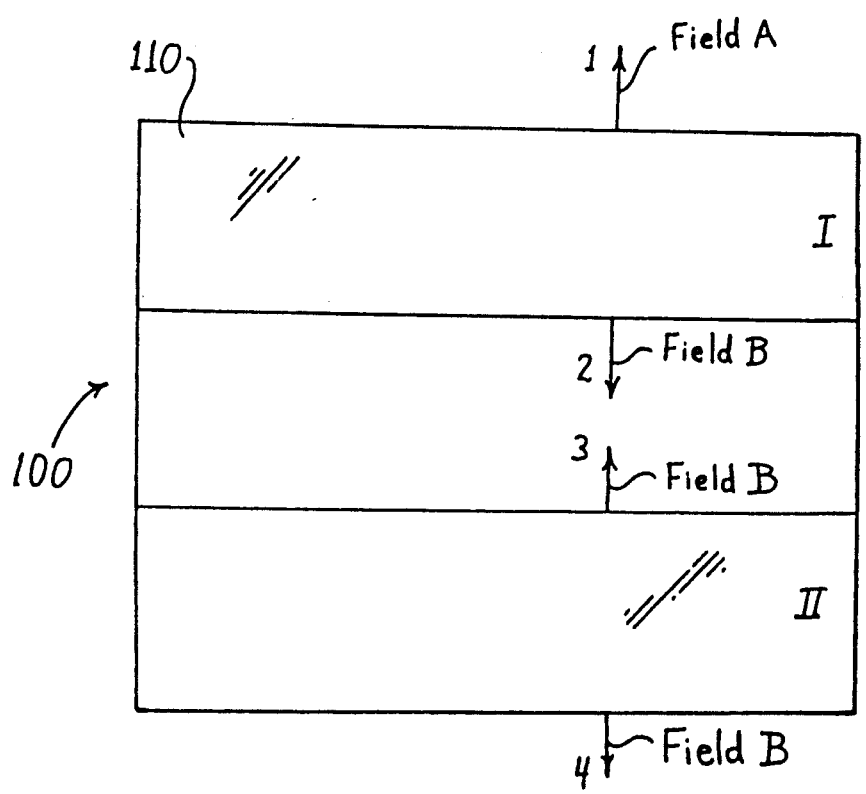
FIG. 2 is a magnet.

In another modification of the invention, cells are indirectly subjected to the influence of a particular directional, or unipolar magnetic field, as illustrated in FIG. 2. A media is placed proximate to and preferably directly on a magnet 100, such that is is subjected to the desired field. The magnet is preferably a compound magnet, such that a first portion emits a field A and a field B. A second magnet is positioned proximate to the first magnet, such that the second magnet's magnetic field B is directed in opposition to the first magnet's field B. In this manner, the fields B of the first and second magnet are effectively canceled, as previously described and only the A fields are permitted to emanate to the surrounding regions. This serves to protect user from the detrimental effects of field B, when applicable.

The media is subjected to the desired magnetic field for a period sufficient to have the desired effect on the media. The media subjected to the magnetic field can be a cosmetic cream, lotion or the like. The media is then applied to the user's body for a period of time, such as overnight. The following morning the media is returned to its place proximate the magnetic field for reactivation. It has been found that the activation of the media degrades with time, thus necessitating the reactivation process. Because the source of the magnetic field radiates both desirable and undesirable magnetic fields, the shielding of the undesirable field can be critical to the well-being of the user. The shielding of the undesirable field and the focusing of the desired field are accomplished as heretofore described.

What is claimed is:

1. A method of regulating a first magnetic field emanating from a first source, which process comprises interposing between a subject and said first source, a second magnetic field emanating from a second source, said second source being disposed with respect to the orientation of the first source, so that the polarity of the second magnetic field is such as to counteract at least some of the magnetic field strength emanating from said first source, whereby said subject is shielded from said first magnetic field emanating from said first source by said second magnetic field emanating from said first source by said second magnetic field emanating from said second source.

2. The method of claim 1 wherein the strength of the magnetic field emanating from said first source is substantially greater than the strength of the magnetic field emanating from said second source.

3. The method of claim 2 wherein the magnetic field strength emanating from the first source is greater than the magnetic field emanating from the second source by a factor of at least about 10 to 1.

4. The method of claim 3 wherein said second source is located at a sufficient distance from the first source so that the magnetic field strength of the second source is sufficient to counteract the field strength emanating from said first source.

5. The method of claim 1 wherein the magnetic field emanating from said first source is an electromagnetic field.

6. The method of claim 1 wherein said second source has natural magnetic properties.

7. The method of claim 1 wherein said second source has electromagnetic properties.

8. The method of claim 1, wherein said first magnetic field from said first source is focused by shielding at least a portion of said first magnetic field from said first source with at least one second magnetic field emanating from at least one second source, said first source being oriented to emanate said first magnetic field in a first predetermined direction, said second source being oriented to emanate a second magnetic field in a second predetermined direction, said second magnetic field being unlike said first magnetic field, said predetermined direction being oriented with respect to said first source, such that said second magnetic field interacts with said first magnetic field emanating from said first source to at least reduce the field strength of a region of said first magnetic field, thereby restricting said first magnetic to a first predetermined region of said first magnetic filed.

9. The method of regulating a first magnetic field of claim 1 wherein said first magnetic field has a north polarity.

10. A device comprised of a first source which radiates magnetic energy and containing thereon a shield comprised of a second magnetic field emanating from a second source, said second source being disposed with respect to the orientation of the first source, so that the polarity of the second magnetic field is such as to counteract at least some of the magnetic field strength emanating from said first source.

11. A method of negating the magnetic field radiating from a first source which comprises:
   a) first source of a first magnetic field and second magnetic field,
      said first magnetic field being different from said second magnetic field,
      said first magnetic field emanating in a first direction and said second magnetic field emanating in a second direction,
      said second direction being substantially opposite said first direction,
   b) second source of a third magnetic field and fourth magnetic field,
      said third magnetic field being different from said fourth magnetic field, said first magnetic field and said fourth magnetic field being essentially identical fields, said third magnetic field emanating in a direction opposite said second magnetic field, said first magnetic field emanating in the same direction as said third magnetic field,
   c) said first source being positioned proximate said second source such that said third field opposes said first field, whereby at least a major portion of said second magnetic field from said first source is negated.

12. The method of claim 11, wherein a media is subjected to said first magnetic field for a predetermined time period, said media is then withdrawn from said first magnetic field and applied to a subject for a predetermined period of time.

13. The method of claim 12, wherein said media is subjected to said first magnetic field for at least about 12 hours and is thereafter applied to said subject.

14. The method of claim 13, wherein said media is topically applied to said subject for a period of at least about 6 hours.

15. The method of regulating a first magnetic field of claim 11 wherein said first magnetic field has a north polarity.

* * * * *